(12) United States Patent
Moore et al.

(10) Patent No.: US 11,493,313 B2
(45) Date of Patent: Nov. 8, 2022

(54) NOSE CONE COMPRISING ELECTRONIC CIRCUIT BOARDS ARRANGED RADIALLY

(71) Applicant: BAE SYSTEMS plc, London (GB)

(72) Inventors: Gary Roy Moore, Portsmouth (GB); Paul Bicknell, Portsmouth (GB)

(73) Assignee: BAE SYSTEMS PLC, London (GB)

(*) Notice: Subject to any disclaimer, the term of this patent is extended or adjusted under 35 U.S.C. 154(b) by 993 days.

(21) Appl. No.: 16/311,981

(22) PCT Filed: Jun. 16, 2017

(86) PCT No.: PCT/GB2017/051759
§ 371 (c)(1),
(2) Date: Dec. 20, 2018

(87) PCT Pub. No.: WO2018/002580
PCT Pub. Date: Jan. 4, 2018

(65) Prior Publication Data
US 2019/0212116 A1    Jul. 11, 2019

(30) Foreign Application Priority Data

Jun. 28, 2016 (EP) .................................. 16275091
Jun. 28, 2016 (GB) .................................. 1611199

(51) Int. Cl.
*F42B 15/01* (2006.01)
*F42B 10/46* (2006.01)
(Continued)

(52) U.S. Cl.
CPC .............. *F42B 15/01* (2013.01); *F42B 10/46* (2013.01); *F42B 30/006* (2013.01); *H05K 1/14* (2013.01);
(Continued)

(58) Field of Classification Search
CPC ........ F42B 15/01; F42B 10/46; F42B 30/006; F42B 19/005; H05K 1/14; H05K 1/141;
(Continued)

(56) References Cited

U.S. PATENT DOCUMENTS 5,889,651 A    3/1999   Sasaki et al.
9,589,598 B1*   3/2017   Gilley ....................... G06F 1/26
(Continued)

FOREIGN PATENT DOCUMENTS

WO    2018002580 A1    1/2018

OTHER PUBLICATIONS

International Preliminary Report on Patentability received for PCT Application No. PCT/GB2017/051759, dated Jan. 10, 2019. 15 pages.
(Continued)

*Primary Examiner* — Anatoly Vortman
*Assistant Examiner* — Zhengfu J Feng
(74) *Attorney, Agent, or Firm* — Finch & Maloney PLLC

(57) ABSTRACT

The invention relates to A nose cone assembly for a munition, comprising a transducer array operably linked to a transmission assembly, wherein the transducer array is operably connected to a transducer housing, said transducer housing comprising a first and second surface, wherein said transmission assembly is reversibly operably connected to the second surface of said transducer housing, said transmission assembly comprising a control board and a plurality of electronic circuit boards, wherein at least one electronic circuit board is a transceiver circuit board, said electronic circuit boards being reversibly connected to the control board and being arranged along their longest dimension, at an axis substantially perpendicular to the control board and further arranged such that
(Continued)

the electronic circuit boards extend radially inwardly to a substantially rotational centre of the control board.

20 Claims, 4 Drawing Sheets

(51) Int. Cl.
| | | |
|---|---|---|
| *H05K 7/14* | (2006.01) | |
| *F42B 30/00* | (2006.01) | |
| *H05K 1/14* | (2006.01) | |
| *H05K 3/36* | (2006.01) | |
| *F42B 19/00* | (2006.01) | |

(52) U.S. Cl.
CPC ............ *H05K 1/141* (2013.01); *H05K 3/366* (2013.01); *H05K 7/1434* (2013.01); *F42B 19/005* (2013.01); *H05K 2201/048* (2013.01); *H05K 2201/09027* (2013.01)

(58) Field of Classification Search
CPC .................. H05K 3/366; H05K 7/1434; H05K 2201/048; H05K 2201/09027
USPC ......................................................... 244/119
See application file for complete search history.

(56) References Cited

U.S. PATENT DOCUMENTS

| | | | |
|---|---|---|---|
| 2003/0169578 A1* | 9/2003 | Blazic .................. | H05K 7/1434 361/796 |
| 2004/0014336 A1 | 1/2004 | Merz | |
| 2005/0024821 A1 | 2/2005 | Arippol | |
| 2005/0068743 A1* | 3/2005 | Ferris .................. | H05K 7/20445 361/721 |
| 2010/0046175 A1* | 2/2010 | Rapp ..................... | F42B 30/006 361/736 |
| 2010/0296258 A1* | 11/2010 | Geswender ............ | H05K 1/144 361/803 |
| 2013/0169578 A1 | 7/2013 | Okazaki | |
| 2014/0085812 A1* | 3/2014 | Ehlen ................. | H05K 7/20145 361/679.49 |

OTHER PUBLICATIONS

International Search Report and Written Opinion received for PCT Application No. PCT/GB2017/051759, dated Dec. 7, 2017. 24 pages.
GB Search Report under Section 17(5) received for GB Application No. 1611199.9, dated Dec. 14, 2016. 4 pages.
Extended European Search Report received for EP Application No. 16275091.3 dated Mar. 17, 2016. 13 pages.
Partial European Search Report received for EP Application No. 16275091.3 dated Dec. 7, 2016. 7 pages.

* cited by examiner

NOSE CONE COMPRISING ELECTRONIC CIRCUIT BOARDS ARRANGED RADIALLY

The invention relates to a nose cone for a munition, more specifically related to the arrangement of electronic components in the nose cone of a signal-emitting projectile, such as a missile or torpedo.

Within the field of steerable, rather than "dumb" munitions a projectile may comprise a number of sections containing various component parts to allow the munition to perform various actions required for its operation. These sections typically comprise a means of propulsion, in order to propel the projectile through the air or water, a warhead or body section, containing the main charge or other output payload and a guidance section, which may include communications for external command input. Though not a requirement, the guidance portion is often located in the nose of the projectile. Given the traditional proportions of even large projectiles, the fitting of electronics into the nose can often be difficult, due to a number of factors, all of which must be considered during the projectiles design.

A projectiles construction has to accommodate the electronics used for systems such as guidance, the power source for the components, such as the electronic e.g. battery, the payload of explosives to be used, including any initiating means, fuel and signalling equipment, whether for the emission of sonar/radar or the actual control of the projectile in motion. The design constraints may be further complicated by the requirement for undertaking maintenance, wherein engineers may be required to change components, update software or replace items in their respective areas throughout the projectile. This can often result in additional time and expense of removing component parts to get to other underlying components, as well as the dealing with difficult to manage sections of equipment, increasing the potential for human error.

The construction of a nose cone section, wherein the nose cone section comprises the guidance components for guided projectiles often requires a signal modification means, such as a transducer, a receive and transmit means as well as a method of interpreting the signals to control the rest of the projectile in order to adjust course, in the example of guidable projectiles. The projectile or nose cone section may also include a means of receiving signals from the launching platform in the field of steerable munitions. These components are often interconnected within the projectile by a large number of Printed Circuit Boards (PCBs) to process or pass the information via a series of interconnecting wires. This leads to a huge difficulty when preforming maintenance, replacing components, managing the heat produced by the various electronic devices and manufacture of the nose cone itself.

According to a first aspect of this invention there is provided a nose cone assembly for a munition, comprising a transducer array operably linked to a transmission assembly, wherein the transducer array is operably connected to a transducer housing, said transducer housing comprising a first and second surface, wherein said transmission assembly is reversibly operably connected to the second surface of said transducer housing, said transmission assembly comprising a control board and a plurality of electronic circuit boards, wherein at least one electronic circuit board is a transceiver circuit board, said electronic circuit boards being reversibly connected to the control board and being arranged along their longest dimension, at an axis substantially perpendicular to the control board and further arranged such that the electronic circuit boards extend radially inwardly to a substantially rotational centre of the control board.

In one arrangement the nose cone cover may comprise a cupola or frustroconical recess to allow the insertion of a transducer housing and transmission assembly. The transducer housing may comprise a transducer array, which comprises at least one transducer; preferably there is a plurality of transducers. The transducer array is responsible for the transduction between an electro-magnetic or acoustic signals, such as, for example a radar or a sonar signal to an electronic signal. In a preferred arrangement there may be a plurality of transducers each requiring electrical connection to the transmission assembly via conductors, such as, for example via through-hole conductors to the second surface.

The transducer array may be mounted the first surface of the transducer housing, and encapsulated by a protective cover.

The second surface of the transducer housing may have a number of electrical connection points to permit transfer of electronic signals between the transducer array and the electronic circuit boards (ecb) of the transmission assembly.

In a preferred arrangement the transmission assembly may be reversibly attached to the second surface of the transducer housing, such as for example, utilising a co-operative push-fit connection between each of the electronic circuit boards of the transmission assembly and the second surface of the transducer housing. The use of individual push-fit connectors allows removal of individual boards, for maintenance or repair, without removing all of the electronic circuit boards.

The electronic circuit boards may also be reversibly attached to the control board of the transmission assembly by further push-fit connectors. The control board, which may itself be a further electronic circuit board, may be used to manage the outputs and inputs to the electronic circuit boards, such as for example the transmissions between the nose cone assembly and the remainder of the munitions components where applicable.

The use of reversible connectors, such as push-fit connectors means between the ecb's and the control board and the transducer housing removes the need for fixed connection means such as wire or solder, which have to be physically broken and detached to permit replacement or testing.

The electronic circuit boards have a longest dimension, and are arranged along their longest dimension at an axis substantially perpendicular to the control board, and the electronic circuit boards are further arranged such that they extend radially inwardly to a substantially rotational centre of the control board This arrangement permits 360 degree access to any of the electronic circuit boards of the transmission assembly, which may facilitate examination in the event of failure, and allows a single electronic circuit board replacement without the need to remove any adjacent or indeed all electronic circuit boards or a multitude of functioning parts to reach a specific electronic circuit board.

In a further arrangement there may be a support hub, located at the substantially rotational centre of the control board. The support hub may provide support to both the electronic circuit boards and therefore the transmission assembly. The support hub may be of any cross section shape of material, preferably the support hub is rigid, and may comprise at least one void, such as, for example a cavity, hollow tube, or a plurality of vent apertures, throughout its length. The at least one void may allow the transfer of heat away from all electronic components such as the electronic control boards in order to assist cooling within the nose cone assembly systems by allowing the passing of a cooling fluid, preferably air. The support hub may also allow electronic connection to the edges of the electronic circuit boards.

In a further arrangement a first support ring may be located around the circumference of the electronic circuit boards. The first support ring may be positioned on the outer edges of the electronic circuit boards and affixed to the outside edges. In a preferred arrangement, the first support ring may be mounted on the control board by at least one support spoke. The support spokes may be interspersed between and orientated in a similar fashion to the electronic circuit boards. The support spokes may be constructed from a rigid material, such as for example polymers, metals, composites, and may provide support for the transmission assembly.

In a further arrangement the transducer housing may comprise a sub-frame, mounted on the second surface of the transducer housing. The sub-frame may comprise at least one support leg and a second support ring. The second support ring may receive the transmission assembly and provide the function of guiding the transmission assembly into engagement with the second surface of the transducer housing. The second support ring may protect the transmission assembly from damage caused by adverse knocks. In a preferred arrangement, during assembly, the second support ring may engage with the first support ring. This may be achieved utilising a mechanical fixing method, such as, for example, a bolt and nut arrangement, however it is more preferable that it is achieved utilising a co-operative a lug and void arrangement, where the first support ring sits inside the second support ring. The co-located first and second support rings may then be mechanically secured together.

The use of modular construction for the nose cone assembly allows the quick and simple detachment, test and reassembly of the separate component parts of the nose cone. In an example arrangement the transmission assembly may be detached from the second surface of the transducer housing and removed from the nose cone, after which individual electronic circuit boards may be unplugged and exchanged by use of the push-fit connections with the control board. After re-fitting the transmission assembly may be returned to the nose cone assembly to be reengaged with the second surface. This arrangement reduces the time, cost and complexity associated with more complex arrangements of component parts, allowing the nose cone to be returned to the munition quickly and the munitions "down-time" being significantly reduced, as well as the associated financial cost.

Whilst the invention has been described above, it extends to any inventive combination of the features set out above, or in the following description, drawings or claims.

Exemplary embodiments of the device in accordance with the invention will now be described with reference to the accompanying drawings in which:—

Figure 1:
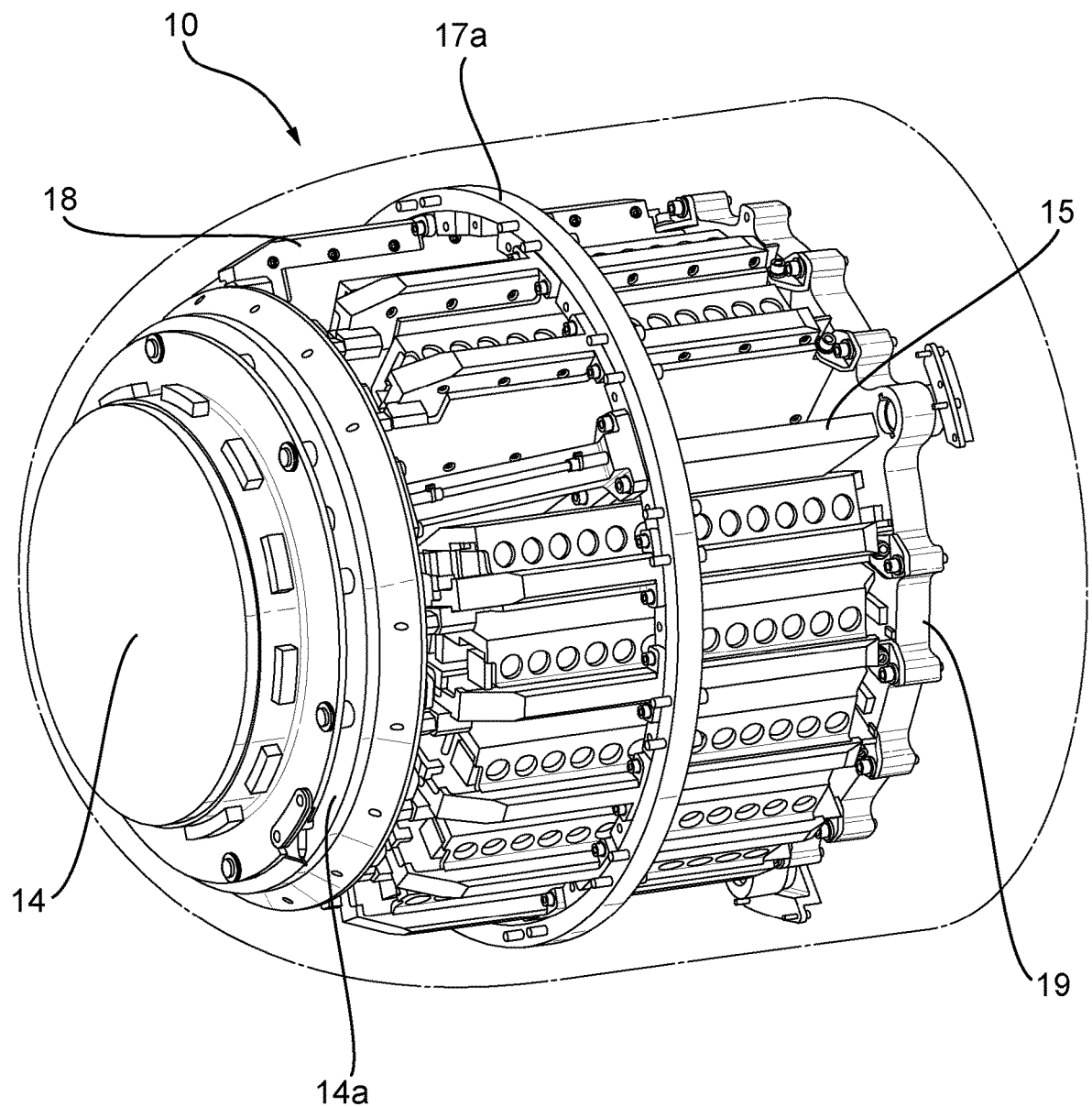
FIG. 1 shows an assembled, modular nose cone assembly.

Referring to FIG. 1, there is shown an assembled nose cone assembly 10 comprising a control board 19 a second support ring 17a linked with a first support ring (not shown) with said second support ring 17a comprising a support leg 16. The electronic circuit boards 18 are arranged around a support hub (not shown) with interspersed support spokes 15 linked to the control board 19, providing additional support to the transmission assembly. A first surface 14a of the transducer housing has mounted thereon the transducer array (not shown), which is protected by a cover 14. The nose cone assembly 10 is the first part to be inserted into the nose cone cover (shown in FIG. 2).

Figure 2:
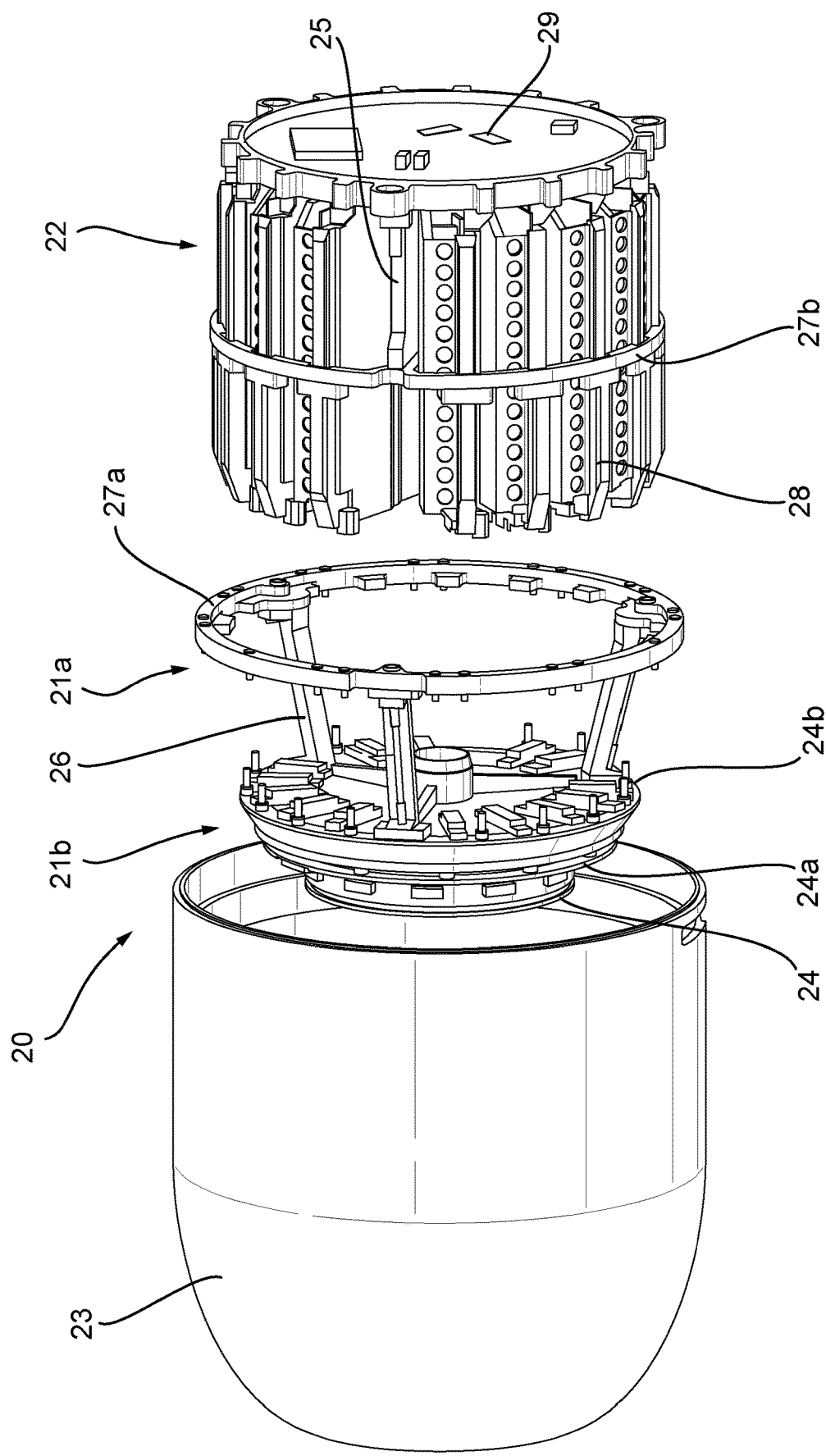
FIG. 2 shows an example, exploded view of the modular nose cone assembly.

Referring to FIG. 2, there is shown an exploded view of the nose cone assembly 20 arrangement. The nose cone assembly 20 comprises a nose cone cover 23, a transducer housing 21b and connected thereto a sub-frame 21a, which is capable of housing the transmission assembly 22. In this embodiment the transducer housing 21b, houses the transducer array (not shown), which is protected by a cover 24. The transducer array may be mounted on the first surface 24a. On the second surface 24b, of the transducer housing is located a sub-frame 21a. The sub-frame 21a comprises three legs 26 and a second support ring 27a for receipt of the transmission assembly 22.

The transmission assembly comprises a control board 29, to which are electrically connected a plurality of electronic circuit boards 28. The control board 29 further comprises a number of support spokes 25 which are attached to a first support ring 27b.

The electronic circuit boards are arranged around a support hub (not shown (see FIG. 3) and are reversibly attached to the control board 29. Support spokes 25 are mounted on the control board 29 and are interspersed between certain electronic circuit boards, and attach to the first support ring 27b.

The arrangement of the first support ring 27b with the second support ring 27a provides both alignment and support for the transmission assembly 22.

The combined transmission assembly 22 and transducer housing 21b may then be slotted into the nose cone cover 23 to form the nose cone assembly 20.

Figure 3:
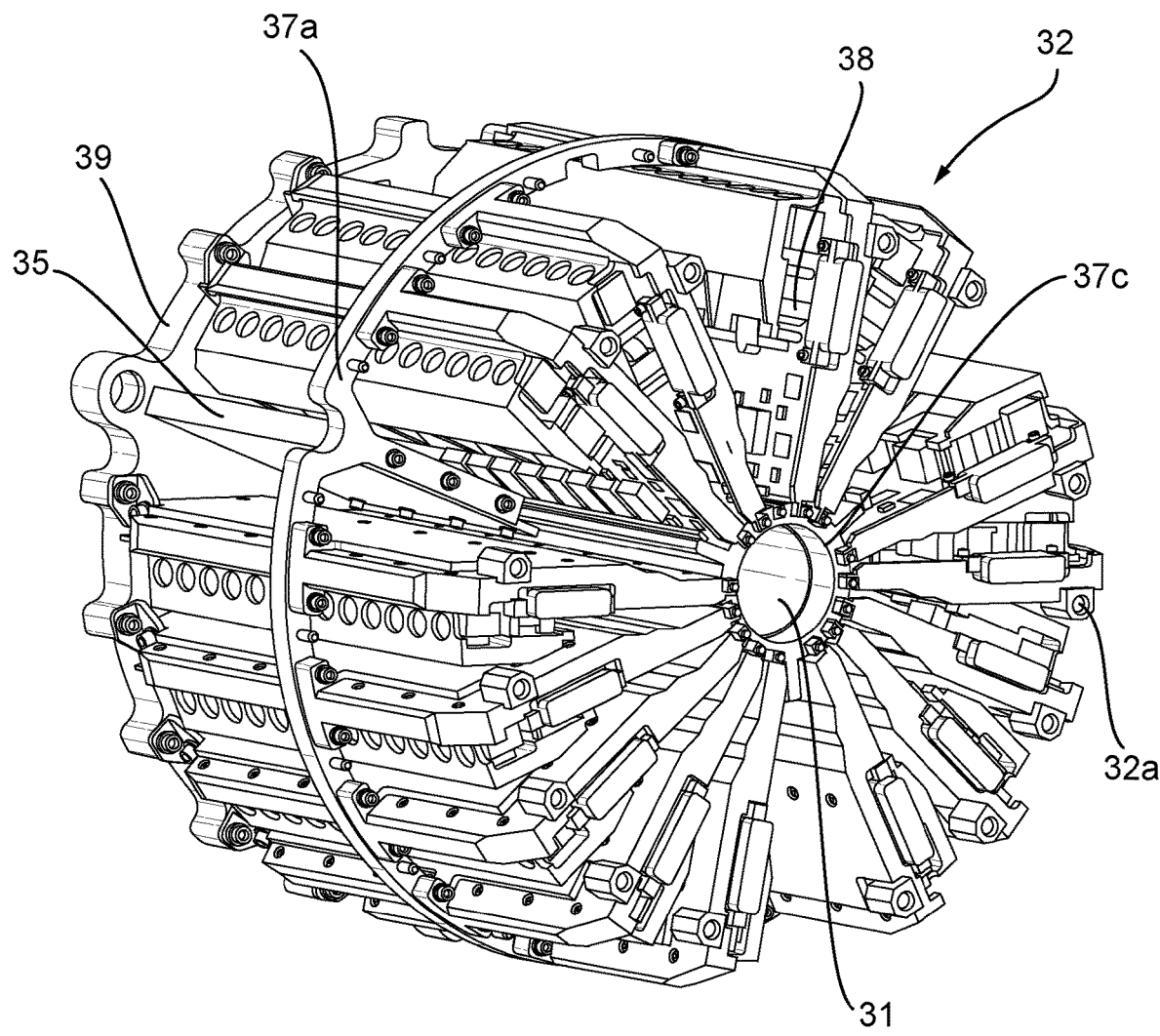
FIG. 3 shows a detailed view of an example transmission assembly and example electronic circuit board arrangement.

Referring to FIG. 3, there is shown a transmission assembly 32, comprising a control board 39. At substantially the rotational centre of the control board 39 there is mounted a support hub 37c, which is substantially perpendicular to the control board 39. The plurality of electronic circuit boards 38 are fixed to the control board 39, the support hub 37c and are further retained in place by support ring 37a.

In the preferred arrangement the electronic circuit boards are arranged onto the control board 39 with an edge of the electronic circuit boards 38 orientated to face the support hub 37c and the substantial rotational centre of the control board 39. Each of the electronic circuit boards' 38 inner facing edges is engaged with the support hub 37a.

In a preferred embodiment there exists a first support ring 37a around the circumference of the electronic circuit boards 38 outer edges, to provide stability and support. Further to this, support spokes 35 may be arranged in positions between the electronic circuit boards 38 to provide support and rigidity between the transmission assembly 32 and the second surface of the transducer housing (not shown).

In the event of a failure of an electronic circuit board 38, the nose cone assembly may be quickly disassembled, the damaged electronic circuit board 38 removed and a new one slotted in, without removing all the electronic circuit boards. The first support ring 37a, the support hub 37c and the transducer housing (not shown) all provide support for the transmission assembly 32, Further rigidity may be provided when the first support ring 37a is fastened to the second support ring (not shown). Further the support hub 37c may contain a void 31 to allow the passage of a cooling fluid to aid in cooling the electronic circuit boards 38. The cooling may be passive or forced cooling.

The electronic circuit boards 38 may comprise a plurality of pin recesses 32a which provide guidance of the component and rigidity to the connection, further there are a plurality of electrical connection recesses (not shown) in order to facilitate a quick electrical connections between the individual electronic circuit boards 38 of the transmission assembly 32 to the transducer housing and transducer array (not shown).

Figure 4:
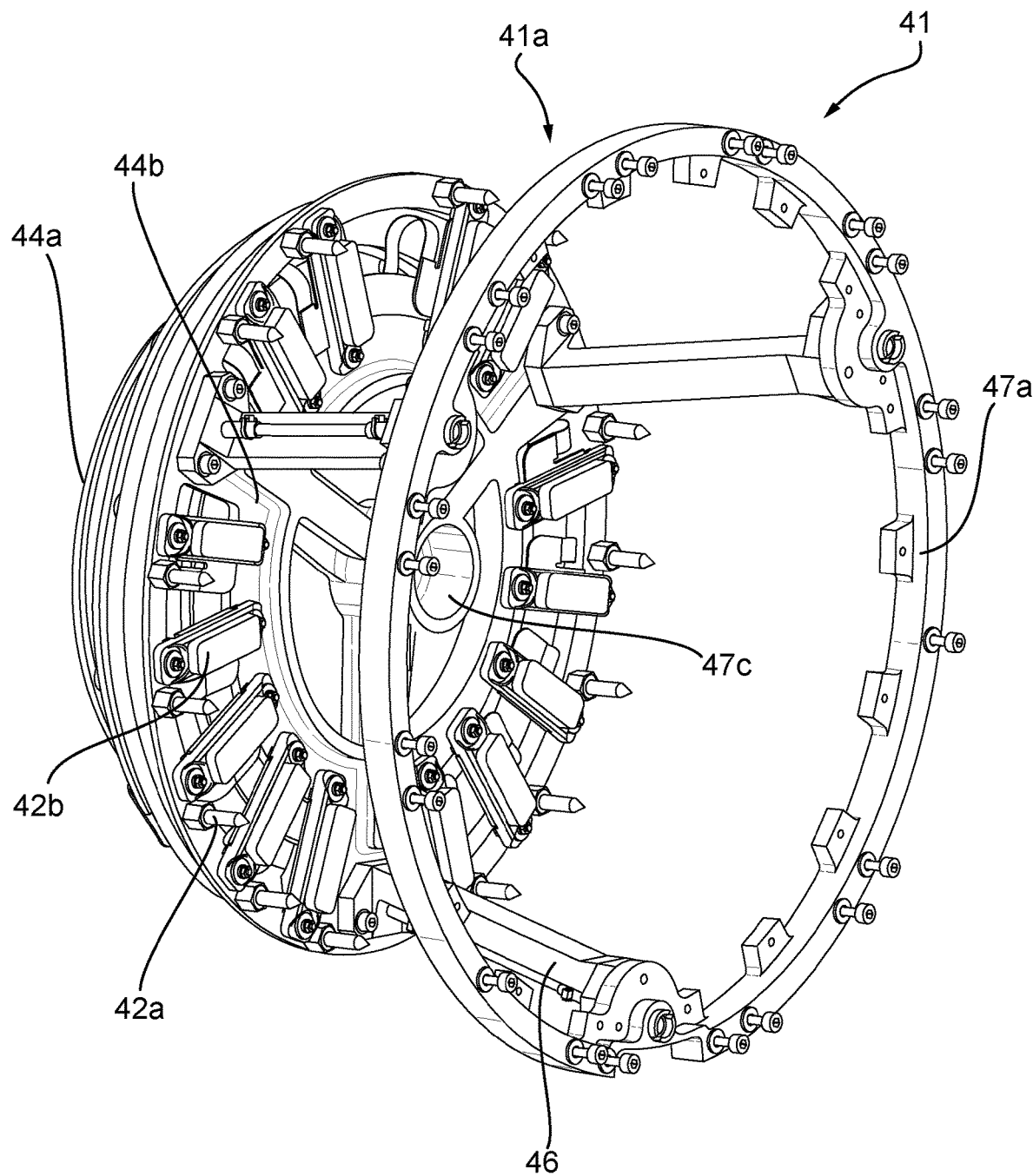
FIG. 4 shows a detailed view of an example transducer housing and sub-frame arrangement.

Referring to FIG. 4, there is shown the transducer housing 41, with a first surface 44a and a second surface 44b. The sub-frame 41a comprises a second support ring 47a which is mounted onto the second surface 44b by support legs 46. The second surface 44b, which comprises a number of protrusions 42b for the receipt of the plurality of electrical connection recesses as well as a support hub recess 47c. Further there are a plurality of pins 42a which cooperatively engage with the plurality of pin recesses 32a (shown in FIG. 3) present on the electronic circuit boards 28. The pins 42a, support hub recess 47c and recesses 32a enable a more secure connection as well as being a guide to locate the electronic circuit boards 28 on the transducer housing 41. This push-fit connection allows faster assembly/disassembly as required.

The invention claimed is:

1. A nose cone assembly for a munition, the nose cone assembly comprising:
a transducer housing comprising a surface; a transmission assembly reversibly operably connected to the surface of said transducer housing, said transmission assembly comprising a control board and a plurality of electronic circuit boards, wherein at least one electronic circuit board is a transceiver circuit board, said electronic circuit boards being reversibly connected to the control board and being arranged along a longest dimension of the electronic circuit boards at an axis substantially perpendicular to the control board, and further arranged such that the electronic circuit boards extend radially inwardly to a center of the control board;
a transducer array operably linked to the transmission assembly, and operably connected to the transducer housing; and
a sub-frame mounted on the surface of the transducer housing, said sub-frame comprising a first support ring, wherein the first support ring of the sub-frame engages with a second support ring of the transmission assembly.

2. The nose cone assembly according to claim 1, wherein a support hub is located at said center of the control board, and said electronic circuit boards are reversibly engaged with the support hub.

3. The nose cone assembly according to claim 2, wherein the support hub comprises a void to allow a flow of a cooling fluid.

4. The nose cone assembly according to claim 1, wherein the electronic circuit boards are each independently operably linked to the surface of the transducer housing.

5. The nose cone assembly according to claim 1, wherein the electronic circuit boards are supported by the first support ring located around a circumference of the electronic circuit boards.

6. The nose cone assembly according to claim 5, wherein at least one support spoke is arranged perpendicularly to the control board for connecting said control board to the support ring.

7. The nose cone assembly according to claim 1, wherein the electronic circuit boards are reversibly engaged with the control board via a push-fit arrangement.

8. The nose cone assembly according to claim 5, wherein the electronic circuit boards are reversibly engaged with the surface of the transducer housing via a push-fit arrangement.

9. The nose cone assembly according to claim 7, wherein the push-fit arrangement comprises a co-operative guide pin and recess arrangement.

10. The nose cone assembly according to claim 1, wherein the sub-frame is mounted on the surface of the transducer housing by at least one mounting leg.

11. An electronic circuit board arrangement, comprising:
a plurality of electronic circuit boards; and
a control board,
wherein the electronic circuit boards are reversibly connected to the control board and are arranged along a longest dimension of the electronic circuit boards at an axis substantially perpendicular to the control board, and further arranged such that the electronic circuit boards extend radially inwardly to a center of the control board, and
wherein the electronic circuit boards are reversibly engaged with the control board via a push-fit arrangement, the push-fit arrangement comprising a co-operative guide pin and recess arrangement.

12. The electronic circuit board arrangement according to claim 11, wherein a support hub is located at said center of the control board, and said electronic circuit boards are reversibly engaged with the support hub.

13. The electronic circuit board arrangement according to claim 12, wherein the support hub comprises a void to allow a flow of a cooling fluid.

14. The electronic circuit board arrangement according to claim 11, wherein the electronic circuit boards are supported by a first support ring located around a circumference of the electronic circuit boards, the first support ring engaging a second support ring of a sub-frame.

15. The electronic circuit board arrangement according to claim 14, wherein at least one support spoke is arranged perpendicularly to the control board for connecting said control board to the first support ring.

16. The nose cone assembly according to claim 1, wherein the surface of the transducer housing is a first surface, the transducer housing further including a second surface, the transducer array being mounted to the second surface of the transducer housing.

17. The nose cone assembly according to claim 16, wherein the transducer array is encapsulated by a protective cover.

18. The nose cone assembly according to claim 8, wherein the push-fit arrangement comprises a co-operative guide pin and recess arrangement.

19. An assembly comprising:
a transducer housing comprising a first surface and a second surface;
a transmission assembly reversibly operably connected to the first surface of said transducer housing, said transmission assembly comprising a control board and a plurality of electronic circuit boards, each of said electronic circuit boards being reversibly connected to the control board and being arranged along a longest dimension of the electronic circuit boards at an axis substantially perpendicular to the control board, and further arranged such that the electronic circuit boards extend radially inwardly to a center of the control board; and a transducer array operably linked to the transmission assembly, and operably connected to the transducer housing, wherein the transducer array is mounted to the second surface of the transducer housing.

20. The assembly according to claim 19, wherein a sub-frame is mounted on the second surface of the transducer housing, said sub-frame comprising a first support ring, wherein the first support ring of the sub-frame engages with a second support ring of the transmission assembly.

\* \* \* \* \*